United States Patent
Ikeuchi et al.

(10) Patent No.: US 7,394,635 B2
(45) Date of Patent: Jul. 1, 2008

(54) CURRENT DETECTION CIRCUIT AND PROTECTION CIRCUIT

(75) Inventors: Akira Ikeuchi, Atsugi (JP); Seiji Miura, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 253 days.

(21) Appl. No.: 11/024,286

(22) Filed: Dec. 28, 2004

(65) Prior Publication Data

US 2005/0190518 A1 Sep. 1, 2005

(30) Foreign Application Priority Data

Feb. 26, 2004 (JP) ............................. 2004-052182

(51) Int. Cl.
*H02H 5/04* (2006.01)

(52) U.S. Cl. ..................................... 361/103

(58) Field of Classification Search .................. 361/103
See application file for complete search history.

(56) References Cited

U.S. PATENT DOCUMENTS

| | | | | | |
|---|---|---|---|---|---|
| 4,263,519 | A | * | 4/1981 | Schade, Jr. .................. | 327/539 |
| 5,559,500 | A | * | 9/1996 | Kase .......................... | 340/664 |
| 5,611,318 | A | * | 3/1997 | Kesler ........................ | 123/630 |
| 5,703,476 | A | * | 12/1997 | Merlo et al. ................ | 323/313 |
| 6,040,720 | A | * | 3/2000 | Kosiec ....................... | 327/83 |
| 6,144,248 | A | * | 11/2000 | Oosugi et al. .............. | 327/525 |
| 6,239,581 | B1 | * | 5/2001 | Yoshida ...................... | 320/162 |
| 6,489,836 | B2 | * | 12/2002 | Yeong ........................ | 327/541 |

FOREIGN PATENT DOCUMENTS

JP 06-188641 7/1994

* cited by examiner

*Primary Examiner*—Michael J Sherry
*Assistant Examiner*—Scott Bauer
(74) *Attorney, Agent, or Firm*—Ladas & Parry LLP

(57) ABSTRACT

A disclosed current detection circuit includes a current/voltage converting element for generating a voltage in accordance with an input current, a reference voltage generation circuit for generating a reference voltage, the reference voltage generation circuit having an element configuration for setting a predetermined temperature characteristic to the reference voltage, and a comparator for outputting an output signal in accordance with a magnitude relation between a voltage converted in the current/voltage converting element and the reference voltage generated in the reference voltage generation circuit.

5 Claims, 6 Drawing Sheets

CURRENT DETECTION CIRCUIT AND PROTECTION CIRCUIT

BACKGROUND OF THE INVENTION

1. Field of the Invention

The present invention generally relates to a current detection circuit, and more particularly to a current detection circuit and a protection circuit for converting input current into voltage with a current/voltage converting element, comparing the converted voltage with a reference voltage, and outputting an output signal in accordance with the magnitude relation obtained from the comparison.

2. Description of the Related Art

A rechargeable accumulator battery such as a lithium ion battery has its characteristic deteriorated by overcharging and/or over-discharging. Accordingly, a protection circuit is provided to a battery pack using an accumulator battery for protecting the accumulator battery from overcharging and/or over-discharging.

The protection circuit detects current flowing between the accumulator battery and a load or a charger, and detects an overcharging state or an over-discharging state based on the detection result. The protection circuit turns off a switching element provided between the accumulator battery and the load or the charger. By turning off the switching element with the protection circuit, the accumulator battery can be protected by being separated from the load or the charger. Here, a current detection circuit is provided to the protection circuit for detecting the overcharging state and/or the over-discharging state.

FIG. 8 is a block diagram showing a configuration of a conventional current detection circuit.

A current detection circuit 100 includes a sense resistance Rs and a comparator circuit 101. The sense resistance Rs is connected in series between a terminal Tin1 and a terminal Tin2 through which detection current flows. A junction point between one end of the sense resistance Rs and the terminal Tin1 is connected to an input terminal Tin11 of the comparator circuit 101, and a junction point between the other end of the sense resistance Rs and the terminal Tin2 is connected to an input terminal Tin12 of the comparator circuit 101.

The comparator circuit 101 includes a reference voltage generation circuit 111 and a comparator 112. The reference voltage generation circuit 111 generates a reference voltage Vref. The reference voltage Vref generated in the reference voltage generation circuit 111 is applied to an inverting input terminal of the comparator 112.

A base potential side of the reference voltage generation circuit 111 has the input terminal Tin12 connected thereto that is applied with the potential of the other end of the sense resistance Rs. A noninverting input terminal of the comparator 112 has the input terminal Tin11 connected thereto and is thus connected to the one end of the sense resistance Rs.

The comparator 112 compares a detection voltage Vs generated, in accordance with detection current, in the sense resistance Rs and the reference voltage Vref generated in the reference voltage generation circuit 111. The comparator 112 provides a high level output when the detection voltage Vs is greater than the reference voltage Vref and provides a low level output when the detection voltage Vs is less than the reference voltage Vref. The output of the comparator 112 is connected to an output terminal Tsout. The output terminal Tsout is supplied to a control circuit of the protection circuit. When the output from the output terminal Tsout of the current detection circuit 100 is a high level output, that is, when an overcharging state is detected, the control circuit switches off a switching element connected in series to the accumulator battery and eliminates the overcharging state (see Japanese Laid-Open Patent Application No. 6-188641).

However, with the conventional current detection circuit, current detection is executed according to a constant reference voltage Vref without considering the temperature characteristic of the voltage Vs converted by the sense resistance Rs. This leads to a problem where detection current varies depending on temperature.

SUMMARY OF THE INVENTION

It is a general object of the present invention to provide a current detection circuit and a protection circuit that substantially obviate one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by a current detection circuit and a protection circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a current detection circuit including: a current/voltage converting element for generating a voltage in accordance with an input current; a reference voltage generation circuit for generating a reference voltage, the reference voltage generation circuit having an element configuration for setting a predetermined temperature characteristic to the reference voltage; and a comparator for outputting an output signal in accordance with a magnitude relation between a voltage converted in the current/voltage converting element and the reference voltage generated in the reference voltage generation circuit.

In the current detection circuit according to an embodiment of the present invention, the predetermined temperature characteristic set to the reference voltage may be the same as a temperature characteristic of the current/voltage converting element.

In the current detection circuit according to an embodiment of the present invention, the predetermined temperature characteristic set to the reference voltage may be different from a temperature characteristic of the current/voltage converting element.

In the current detection circuit according to an embodiment of the present invention, the reference voltage generation circuit may further include a control part or controlling the reference voltage to a voltage smaller than a predetermined voltage when the reference voltage reaches the predetermined voltage.

Furthermore, the present invention provides a protection circuit including: a current/voltage converting element for generating a voltage in accordance with an input current; a reference voltage generation circuit for generating a reference voltage, the reference voltage generation circuit having an element configuration for setting a temperature characteristic to the reference voltage; a comparator for outputting an output signal in accordance with a magnitude relation between a voltage converted in the current/voltage converting element and the reference voltage generated in the reference voltage generation circuit; and a control part for controlling the input current in accordance with the output from the comparator.

Other objects and further features of the present invention will be apparent from the following detailed description when read in conjunction with the accompanying drawings.

DESCRIPTION OF THE PREFERRED EMBODIMENTS

Figure 1:
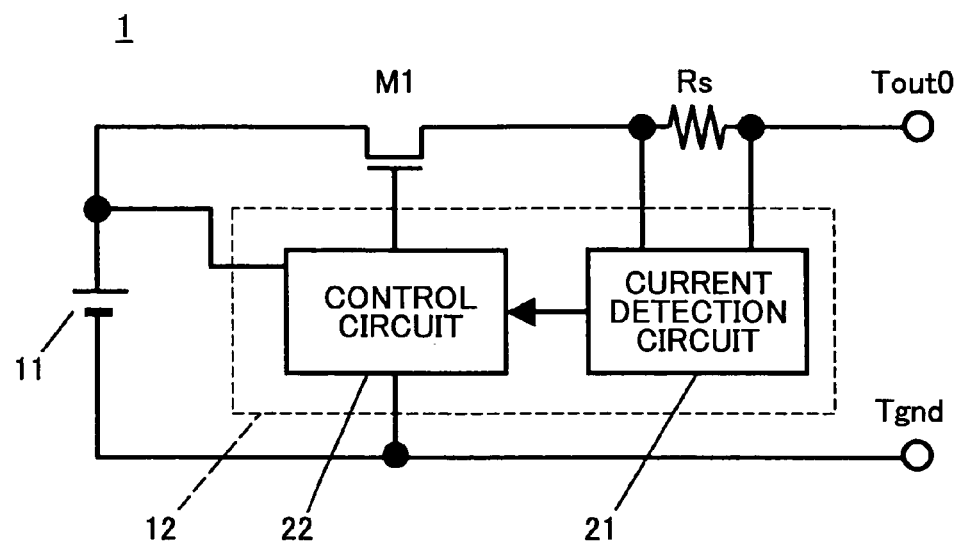
FIG. 1 is a block diagram showing a configuration of an embodiment of the present invention.

FIG. 1 is a block diagram showing a configuration of an embodiment of the present invention.

A battery pack 1 according to this embodiment includes an accumulator battery 11, a protection IC 12, a switching transistor M1, and a sense resistance Rs.

The accumulator battery 11 has a positive electrode connected to an output terminal Tout0 via the switching transistor M1 and the sense resistance Rs, and a negative electrode connected to a ground terminal Tgnd.

The protection IC 12 includes a current detection circuit 21 and a control circuit 22. The current detection circuit 21 detects the current flowing in the accumulator battery 11 from the voltages of both ends of the sense resistance Rs. The current detection circuit 21 outputs a high level output when the voltage generated by the detected current exceeds a reference voltage Vref. The control circuit 22 switches off the switching transistor M1 when the high level output is output from the current detection circuit 21. By switching off the switching transistor M1, the accumulator battery 11 and the output terminal Tout0 are disconnected and the current flowing in the accumulator battery 11 is cut off. Thereby, the accumulator battery 11 is protected.

Figure 2:
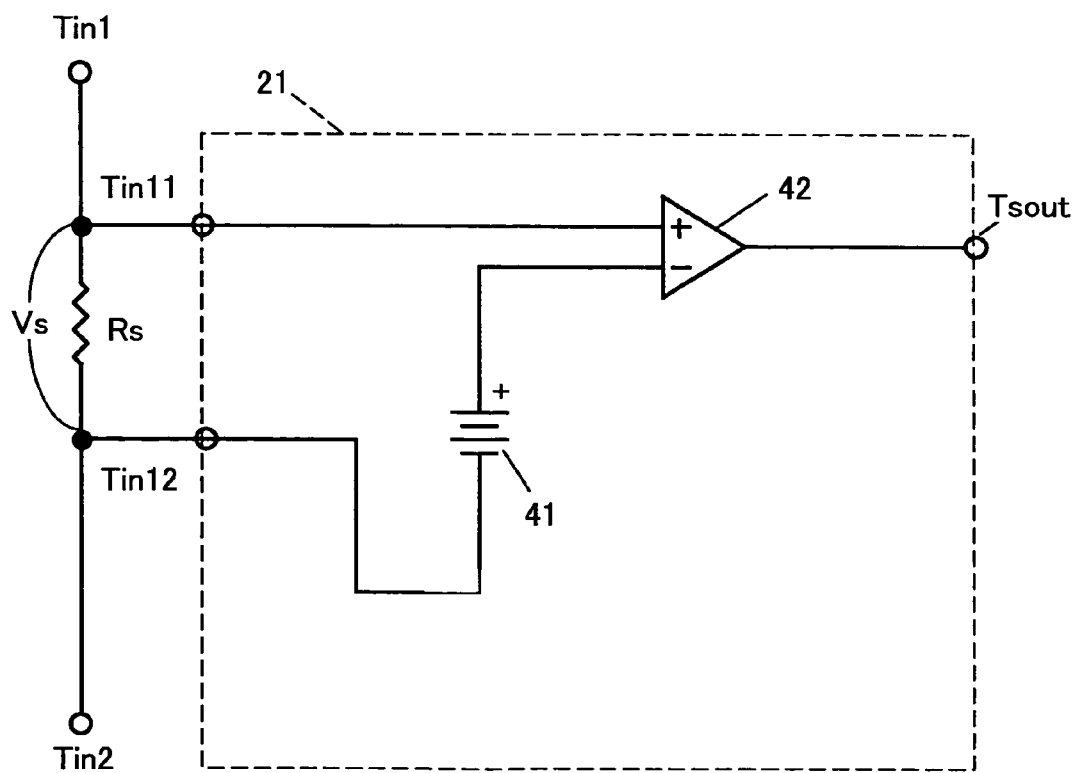
FIG. 2 is a circuit diagram showing a configuration of a current detection circuit 21.

Next, the current detection circuit 21 is described in detail. FIG. 2 is a circuit diagram showing an exemplary configuration of the current detection circuit 21.

The current detection circuit 21 in this embodiment includes a reference voltage generation circuit 41 and a comparator 42.

The sense resistance Rs is connected in series between a terminal Tin1 and a terminal Tin2 through which a detection current Is flows. A detection voltage Vs (Vs=Rs×Is) is generated across the sense resistance Rs in accordance with the detection current Is. One end of the sense resistance Rs is connected to an input terminal Tin11 of the current detection circuit 21, and the other end of the sense resistance Rs is connected to an input terminal Tin12 of the current detection circuit 21.

Figure 3:
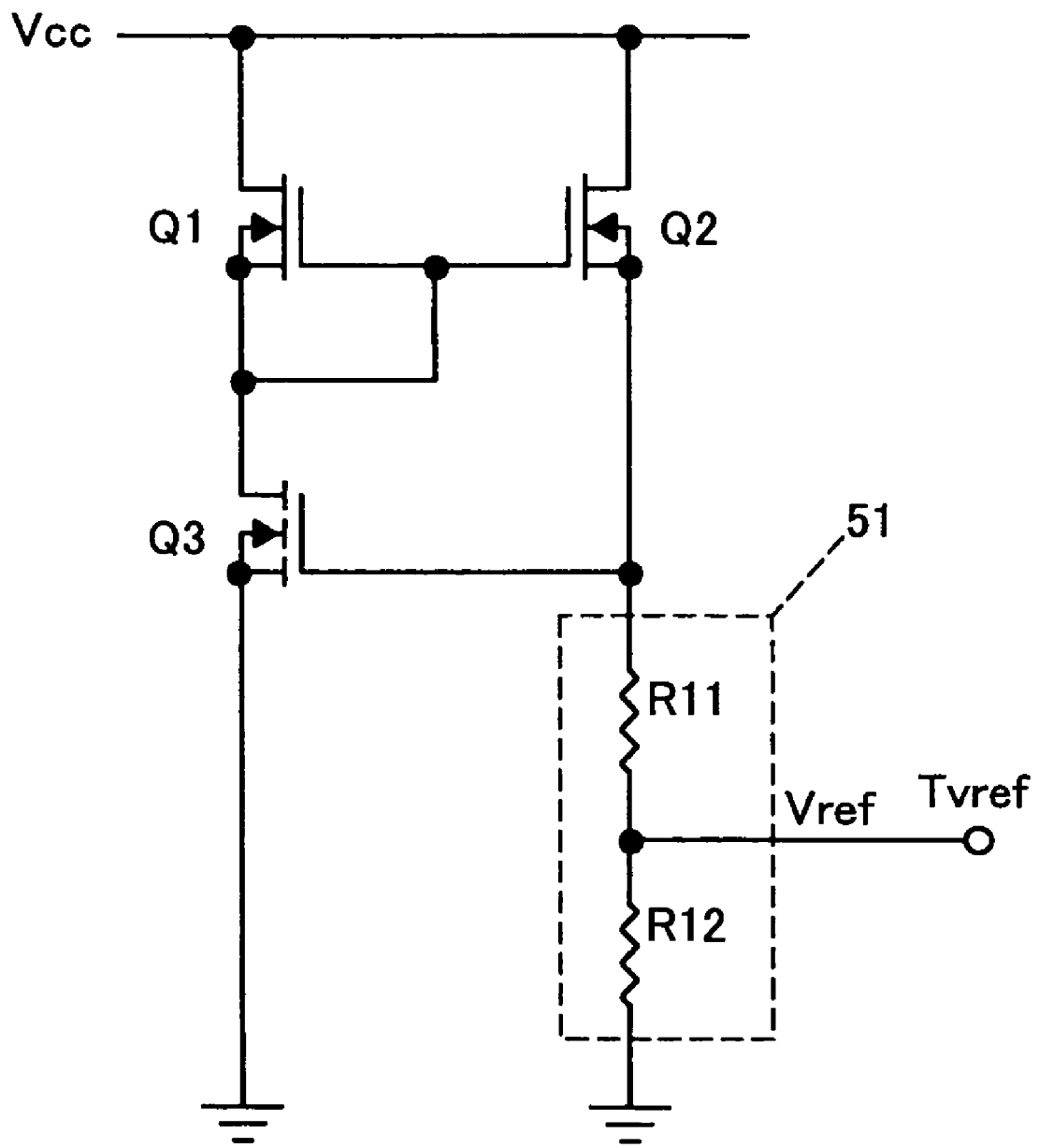
FIG. 3 is a circuit diagram showing a configuration of a reference voltage generation circuit 41.

FIG. 3 is a circuit diagram showing an exemplary configuration of the reference voltage generation circuit 41.

The reference voltage generation circuit 41 includes MOS field effect transistors Q1-Q3 and a voltage divider circuit 51. The transistor Q1, being formed of an N-channel depletion type MOS field effect transistor, has a drain applied with a drive voltage Vcc, a source connected to a drain of the transistor Q3, and a gate connected to a source of the transistor Q1 and a gate of the transistor Q2.

The transistor Q2, being formed of an N-channel depletion type MOS field effect transistor, has a drain applied with the drive voltage Vcc, a source connected to the voltage divider circuit 51 connecting a resistance R11 and a resistance R12 in series, and a gate connected to the gate and the source of the transistor Q1.

The transistor Q3, being formed of an N-channel enhancement type MOS field effect transistor, has a drain connected to the source and drain of the transistor Q1, a source applied with a base voltage V0 of the reference voltage generation circuit 21, and a gate connected to a junction point between the transistor Q2 and the voltage divider circuit 51.

The voltage divider circuit 51 includes the resistance R11 and the resistance R12 connected in series. The voltage divider circuit 51 is connected between a junction point between the source of the transistor Q2 and the gate of the transistor Q3, and the base voltage V0. The voltage divider circuit 51 divides a constant voltage, generated at the junction point between the source of the transistor Q2 and the gate of the transistor Q3, with the resistance R11 and the resistance R12, and outputs the divided voltage as reference voltage Vref from a junction point between the resistance R11 and the resistance R12.

The junction point between the resistance R11 and the resistance R12 is connected to a reference voltage output terminal Tvref, and the reference voltage Vref is output from the reference voltage output terminal Tvref. The reference voltage output terminal Tvref is connected to an inverting input terminal of the comparator 42.

The comparator 42 has a noninverting input terminal connected to the input terminal Tin11. It is to be noted that, in the reference voltage generation circuit 41, the voltage from the input terminal Tin12 to the other end of the sense resistance Rs is supplied as the base voltage V0.

The comparator 42 compares the detection voltage Vs generated in the sense resistance Rs and the reference voltage Vref generated in the reference voltage generation circuit 41. The comparator 42 outputs a high level output when the detection voltage Vs is greater than the reference voltage Vref and outputs a low level output when the detection voltage Vs is less than the reference voltage Vref.

Here, the temperature characteristic of the reference voltage Vref generated in the reference voltage generation circuit 41 is set for reducing the influence of the temperature characteristic of the sense resistance Rs. For example, in a case where the temperature characteristic of the sense resistance Rs has a positive temperature characteristic, the reference voltage Vref is set to have a positive temperature characteristic.

Next, a method of setting the temperature characteristic of the reference voltage Vref is described.

The reference voltage Vref is determined in accordance with a ratio between a channel area of the transistor Q1 (Q2) and a channel area of the transistor Q3 in the reference voltage generation circuit 41.

Figure 4:
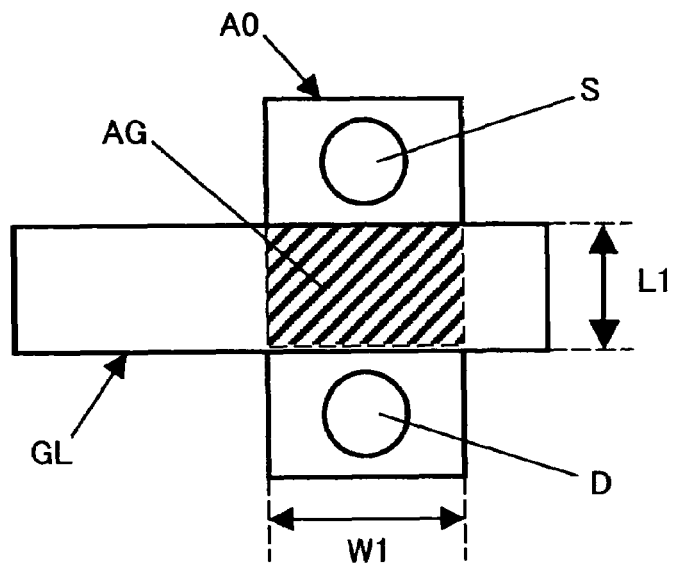
FIG. 4 is a plan view of a transistor Q1 on a semiconductor chip.

FIG. 4 is a plan view showing the transistor Q1 on a semiconductor chip.

In FIG. 4, letter AG indicates a configuration space of the transistor Q1, and a space A0 is formed having a width of W1. Furthermore, letter S indicates a source, and letter D indicates a drain. On the configuration space A0, a gate electrode GL is wired on the configuration space A0 via an insulating layer. The gate electrode GL is formed having a width of L1. Here, the ratio of the sides of the channel forming the transistor Q1 (Q2) is represented as W1/L1. It is to be noted that the same applies to the transistor Q3, in which the ratio of the sides of the channel forming the transistor Q3 is represented as W3/L3, wherein the configuration space A0 is formed having a width of W3, and the gate electrode GL is formed having a width of L3.

In a case where the letter A is a ratio of the sides of the channel forming the transistor Q1 (W1/L1) and where the letter B is a ratio of the sides of the channel forming the transistor Q3, respective characteristics of the reference voltage Vref are, in general, determined according to these ratios.

Figure 5:
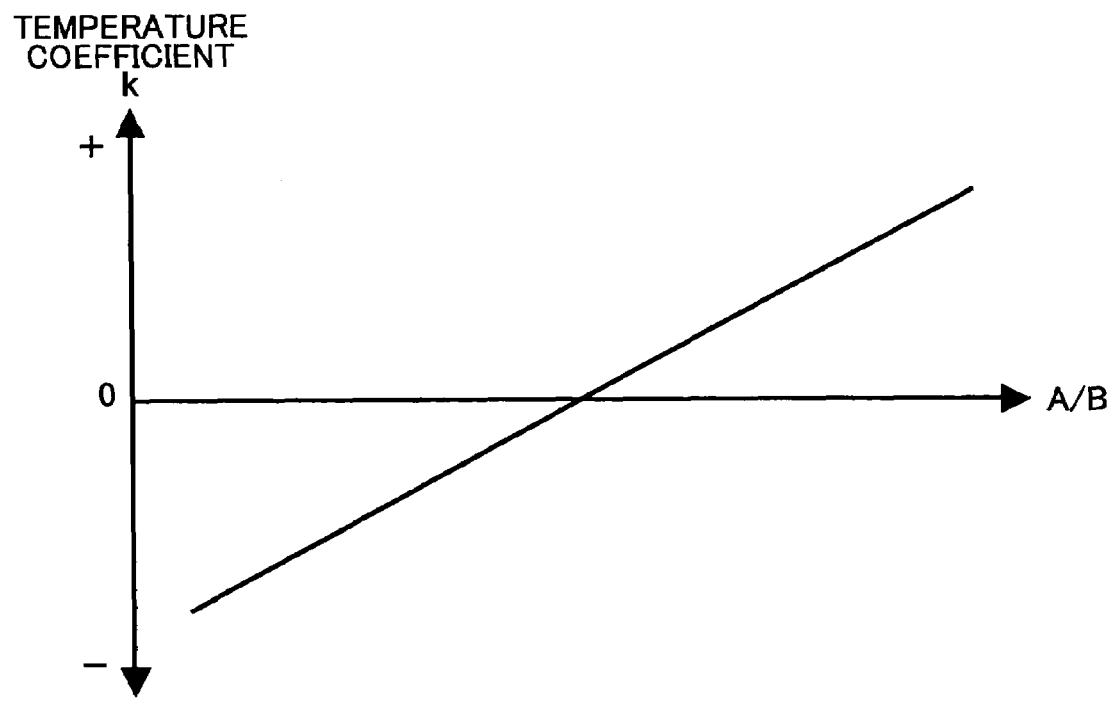
FIG. 5 is a graph showing the characteristic in the change of temperature coefficient with respect to (A/B)

FIG. 5 is a drawing showing the characteristic in the change of temperature coefficient with respect to a ratio (A/B) of the transistor Q1 and the transistor Q3.

As shown in FIG. 5, the temperature coefficient has a characteristic of becoming larger as the ratio (A/B) increases. Furthermore, at a predetermined ratio (A0/B0), the temperature coefficient becomes 1 and the reference voltage Vref becomes unaffected by temperature.

Therefore, by setting the ratio (A/B) of the transistor Q1 and the transistor Q3, the temperature characteristic of the reference voltage Vref can be set to a desired characteristic. Accordingly, by setting the ratio (A/B) of the transistor Q1 and the transistor Q3 to a ratio enabling the temperature characteristic of the reference voltage to offset the temperature characteristic of the sense resistance Rs, the output of the comparator 42 can be unaffected by temperature.

In a case where the detection voltage Vs of the sense resistance Rs shows a tendency of increasing in correspondence with temperature, the output of the comparator 42 can be prevented from being affected by temperature by setting the reference voltage Vref so that it too may increase in correspondence with temperature. This allows the output of the comparator to be prevented from being reversed by temperature.

It is to be noted that, although this embodiment is applied to a case of overcurrent, the embodiment may also be applied to a case of detecting reduction of current, that is, detection of overcharging.

Furthermore, although this embodiment sets the temperature characteristic in accordance with the shapes of the channels of the transistors Q1 (Q2) and Q3, the temperature difference may, for example, be set in accordance with the widths, lengths and/or thickness of the resistances R11 and R12.

In this embodiment, the shapes of the channels of the transistor Q1 (Q2) and transistor Q3 in the reference voltage generation circuit 41 are set only to offset the temperature characteristic of the sense resistance Rs. However, since the temperature characteristic can be set to a desired temperature characteristic by setting the shapes of the channels of the transistors Q1, Q2 and Q3, in addition to offsetting the temperature characteristic of the sense resistance Rs, the temperature characteristic may alternatively be controlled to have a desired temperature characteristic when necessary.

Furthermore, in addition to controlling the temperature characteristic of the reference voltage to offset the temperature characteristic of the sense resistance Rs, the reference voltage Vref may be controlled so that it makes a steep drop at a predetermined temperature.

Figure 6:
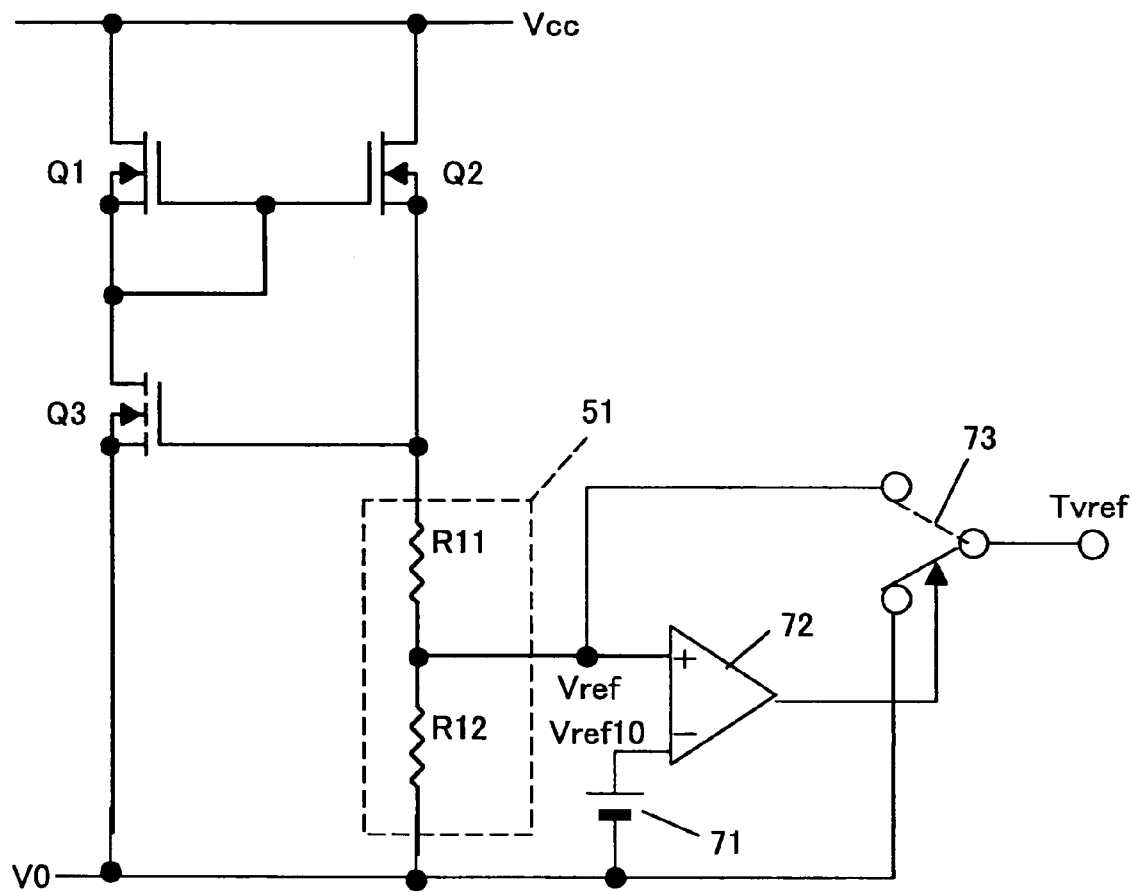
FIG. 6 is a circuit diagram showing a configuration of an exemplary variation of the reference voltage generation circuit 41.

FIG. 6 is a circuit diagram showing a configuration of an exemplary variation of the reference voltage generation circuit 41. In FIG. 6, like components are denoted with like numerals as of FIG. 3 and will not be further described.

In this variation, a reference voltage generation circuit 61 is added with a reference voltage source 71, a comparator 72, and a switching element 73. The reference voltage source 71 generates a reference voltage Vref10 having no temperature characteristic and supplies the reference voltage Vref10 to an inverting input terminal of the comparator 72. A reference voltage Vref is supplied from the voltage divider circuit 51 to a noninverting input terminal of the comparator 72. The comparator 72 compares the reference voltage Vref and the reference voltage Vref10. The comparator 72 outputs a high level output when the reference voltage Vref is greater than the reference voltage Vref10 and outputs a low level output when the reference voltage Vref is less than the reference voltage Vref10.

The output of the comparator 72 is supplied to the switching element 73. The switching element 73, being supplied with the reference voltage Vref and a base voltage Vref0 from the voltage divider circuit 51, supplies the reference voltage Vref to the inverting input terminal of the comparator 72 when the output of the comparator 72 is a low level output and supplies the base voltage Vref0 when the output of the comparator 72 is a high level output.

Figure 7:
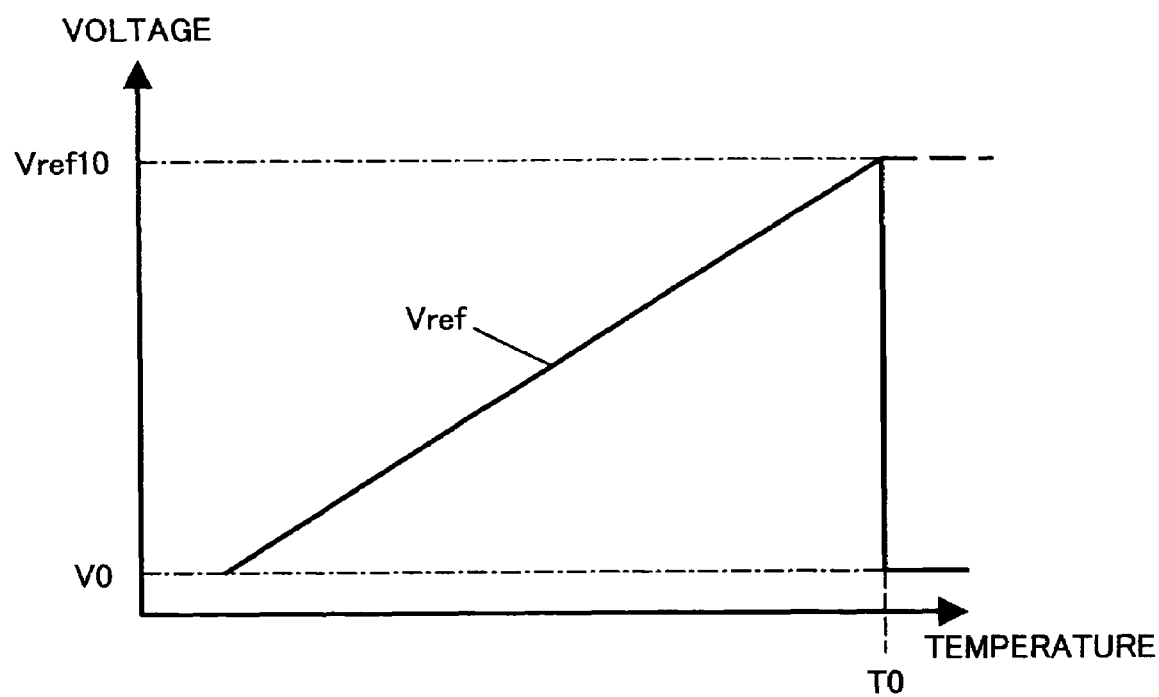
FIG. 7 is a graph for explaining an operation of a reference voltage generation circuit 61.
Figure 8:
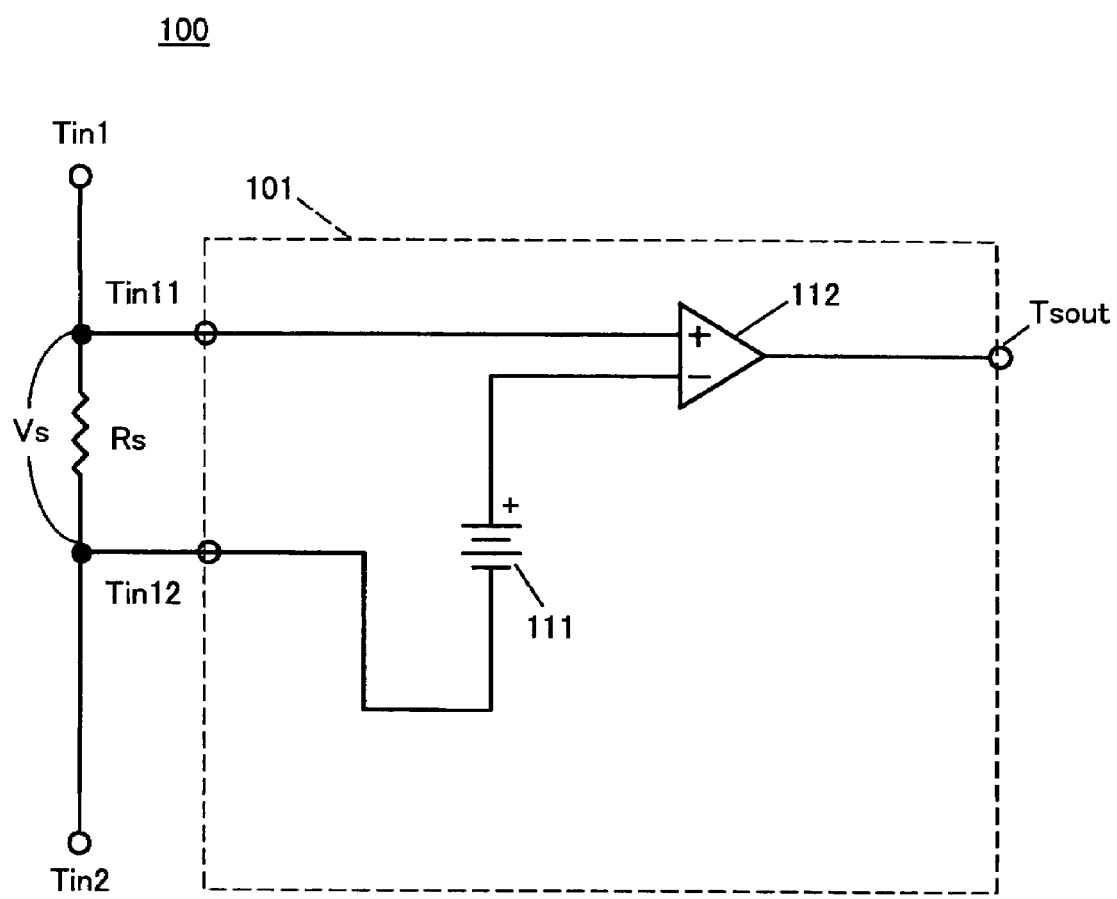
FIG. 8 is a circuit diagram showing a configuration of a current detection circuit.

FIG. 7 is a diagram showing the change of the reference voltage Vref with respect to the temperature in the reference voltage generating circuit 61.

As shown in FIG. 7, when the reference voltage Vref reaches a predetermined temperature T0 and thus when the reference voltage Vref reaches a constant voltage Vref10, the switching element 73 switches to supply the base voltage V0 to the inverting input terminal of the comparator 42.

In this variation, when the reference voltage Vref reaches a predetermined voltage, that is, when the reference voltage Vref reaches a predetermined temperature, the base voltage V0 is applied as the voltage to the inverting input terminal of the comparator 72. Accordingly, the high level output can be surely output from the comparator 22, the switching transistor M1 can be switched off, and the current flowing in the accumulator battery 11 can be disconnected. Thereby the accumulator battery 11 can be protected from, for example, overheating.

It is to be noted that although this variation applies the base voltage V0 as the reference voltage to the inverting input terminal of the comparator 72 when the reference voltage Vref becomes a predetermined voltage, that is, when the temperature reaches the predetermined temperature T0, alternatively, the reference voltage Vref may be maintained at a predetermined voltage by employing, for example, a capacitor, and the predetermined voltage may be applied to the inverting input terminal of the comparator 22.

Further, the present invention is not limited to these embodiments, but variations and modifications may be made without departing from the scope of the present invention.

The present application is based on Japanese Priority Application No. 2004-052182 filed on Feb. 26, 2004, with the Japanese Patent Office, the entire contents of which are hereby incorporated by reference.

What is claimed is:

1. A current detection circuit comprising:
a current/voltage converting element for generating a voltage in accordance with an input current;
a reference voltage generation circuit for generating a reference voltage, the reference voltage generation circuit having an element configuration for setting a predetermined temperature characteristic to the reference voltage; and a comparator for outputting an output signal in accordance with a magnitude relation between a voltage converted in the current/voltage converting element and the reference voltage generated in the reference voltage generation circuit;

wherein the element configuration of the reference voltage generation circuit includes a first transistor having a first channel area and a second transistor having a second channel area, the first channel area and the second channel area has a ratio determining the reference voltage, wherein the element configuration of the reference voltage generation circuit further includes first and second resistances connected in series, wherein the reference voltage is output from a junction point between the first and second resistances, wherein the ratio enables the temperature characteristic of the reference voltage output from the junction point to offset the temperature characteristic of the voltage output from the current/voltage converting element.

2. The current detection circuit as claimed in claim 1, wherein the predetermined temperature characteristic set to the reference voltage is the same as a temperature characteristic of the current/voltage converting element.

3. The current detection circuit as claimed in claim 1, wherein the predetermined temperature characteristic set to the reference voltage is different from a temperature characteristic of the current/voltage converting element.

4. The current detection circuit as claimed in claim 1, wherein the reference voltage generation circuit further includes a control part for controlling the reference voltage to a voltage smaller than a predetermined voltage when the reference voltage reaches the predetermined voltage.

5. A protection circuit comprising:

a current/voltage converting element for generating a voltage in accordance with an input current;

a reference voltage generation circuit for generating a reference voltage, the reference voltage generation circuit having an element configuration for setting a predetermined temperature characteristic to the reference voltage;

a comparator for outputting an output signal in accordance with a magnitude relation between a voltage converted in the current/voltage converting element and the reference voltage generated in the reference voltage generation circuit; and a control part for controlling the input current in accordance with the output from the comparator;

wherein the element configuration of the reference voltage generation circuit includes a first transistor having a first channel area and a second transistor having a second channel area, the first channel area and the second channel area has a ratio determining the reference voltage, wherein the element configuration of the reference voltage generation circuit further includes first and second resistances connected in series, and wherein the reference voltage is output from a junction point between the first and second resistances, wherein the ratio enables the temperature characteristic of the reference voltage output from the junction point to offset the temperature characteristic of the voltage output from the current/voltage converting element.

* * * * *